United States Patent [19]
Garlepp et al.

[11] Patent Number: 6,133,773
[45] Date of Patent: *Oct. 17, 2000

[54] VARIABLE DELAY ELEMENT

[75] Inventors: Bruno Werner Garlepp, Mountain View; Pak Shing Chau, San Jose; Kevin S. Donnelly, San Francisco; Clemenz Portmann, Cupertino; Donald C. Stark, Los Altos; Stefanos Sidiropoulos, Stanford; Leung Yu, Santa Clara; Benedict Chung-Kwong Lau; Roxanne Vu, both of San Jose, all of Calif.

[73] Assignee: Rambus Inc, Mountain View, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/947,477

[22] Filed: Oct. 10, 1997

[51] Int. Cl.$^7$ .............................. H03K 5/13; H03H 11/16
[52] U.S. Cl. .......................... 327/247; 327/246; 327/231; 327/266; 327/274
[58] Field of Search ..................... 327/246, 277, 327/287, 3, 156, 237, 231, 266, 274, 20

[56] References Cited

U.S. PATENT DOCUMENTS

| | | | |
|---|---|---|---|
| 4,338,569 | 7/1982 | Petrich | 327/158 |
| 4,884,041 | 11/1989 | Walker | 331/57 |
| 5,180,994 | 1/1993 | Martin et al. | 331/38 |
| 5,399,995 | 3/1995 | Kardontchik et al. | 331/17 |
| 5,451,894 | 9/1995 | Guo | 327/241 |
| 5,485,490 | 1/1996 | Leung et al. | 375/371 |
| 5,506,815 | 4/1996 | Hsich et al. | 365/230.03 |
| 5,513,327 | 4/1996 | Farmwald et al. | 710/129 |
| 5,532,633 | 7/1996 | Kawai | 327/174 |
| 5,534,805 | 7/1996 | Miyazaki et al. | 327/144 |
| 5,550,783 | 8/1996 | Stephens, Jr. et al. | 365/233 |
| 5,554,945 | 9/1996 | Lee et al. | 327/105 |
| 5,570,054 | 10/1996 | Takla | 327/292 |
| 5,614,855 | 3/1997 | Lee et al. | 327/158 |
| 5,673,295 | 9/1997 | Read et al. | 375/356 |
| 5,712,883 | 1/1998 | Miller et al. | 375/371 |
| 5,712,884 | 1/1998 | Jeong | 375/376 |
| 5,745,792 | 4/1998 | Jost | 710/58 |
| 5,764,092 | 6/1998 | Wada et al. | 327/271 |
| 5,799,051 | 8/1998 | Leung et al. | 327/287 |
| 5,801,985 | 9/1998 | Roohparvar et al. | 365/185.01 |
| 5,890,014 | 3/1999 | Long | 710/8 |

OTHER PUBLICATIONS

"The Phase–Locked Loop," Internet Paper, downloaded from http://yake.ecn.purdue.edu/~roos/modem/pll/pll.html, pp. 1–3.

Dehon, Andre, "In–System Timing Extraction and Control Through Scan–Based, Test–Access Ports," (original publication Jan. 1994), Internet Paper, downloaded from http://www.ai.mit.edu/projects/transit/tn102/.html#vcdl, pp. 1–19.

Sidiropoulos et al., "A Semi–Digital DLL With Unlimited Phase Shift Capability and 0.08 –400 MHz Operating Range," 1997 IEEE Intn'l Solid State Circuits Cinf., 5 pages.

Lee et al., "A 2.5 V CMOS Delay–Locked Loop For An 18 Mbit, 500 Megabte/s DRAM," IEEE Journal of Solid State Circuits, vol. 2, No. 12, Dec. 1994.

Halaketama et al., "A 256 Mb SDRAM Using A Register–Controlled Digital DLL," IEEE, ISSCC97/Session 4/DRAM/Paper TP 4.5 (Feb. 6, 1997).

Reese et al., "A Phase–Tolerant 3.8 GB/s Data–Communication Router for a Multiprocessor Supecomputer Backplate," IEEE, ISSCC94/ Session 18/ High–Performance Logic and Circuit Techniques /Paper FA 18.4, IEEE Intn'l Solid State Circuits Conference (Feb. 18, 1994).

Tanoi, et al., "A 250–622 Mhz Deskew and Jitter–Suppressed Clock Buffer Using Two–Loop Architecture," IEEE Journal of Solid State Circuits, vol. 31, No. 4 (Apr. 1996).

*Primary Examiner*—Dinh T. Le

[57] ABSTRACT

A method and apparatus for an adjustable phase interpolator is provided. The adjustable phase interpolator includes a phase interpolator circuit that has a voltage input and a voltage output. The adjustable phase interpolator further includes a controllable capacitive load coupled to either the input or the output of the phase interpolator circuit. The controllable capacitive load is designed to add or subtract capacitance to the adjustable phase interpolator.

27 Claims, 13 Drawing Sheets

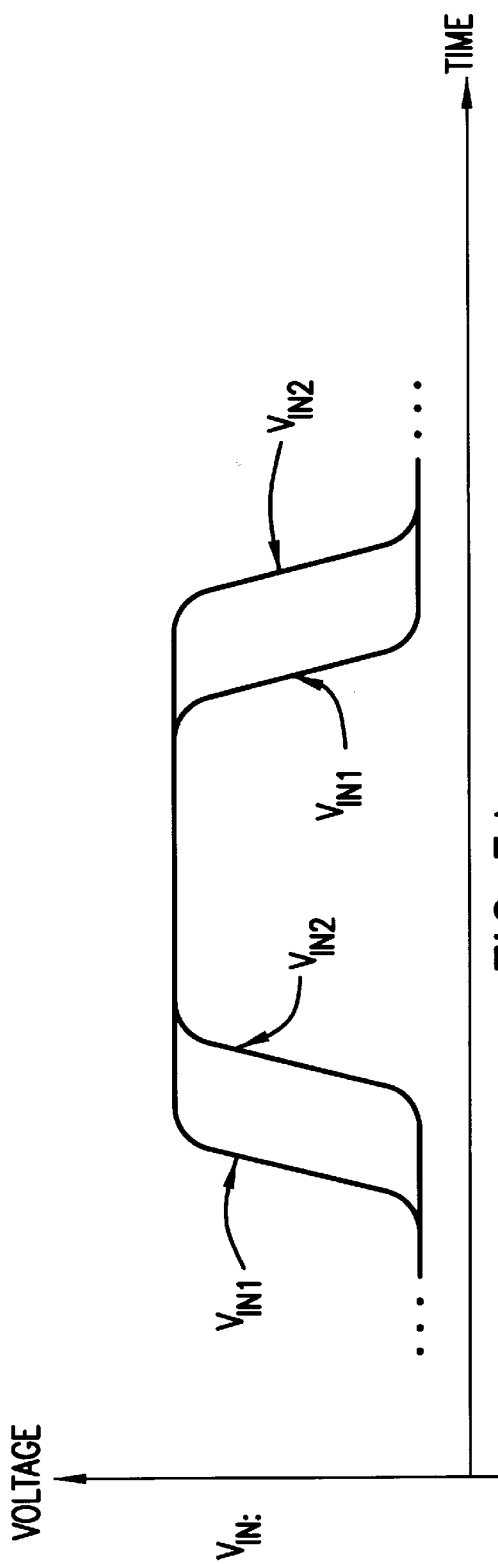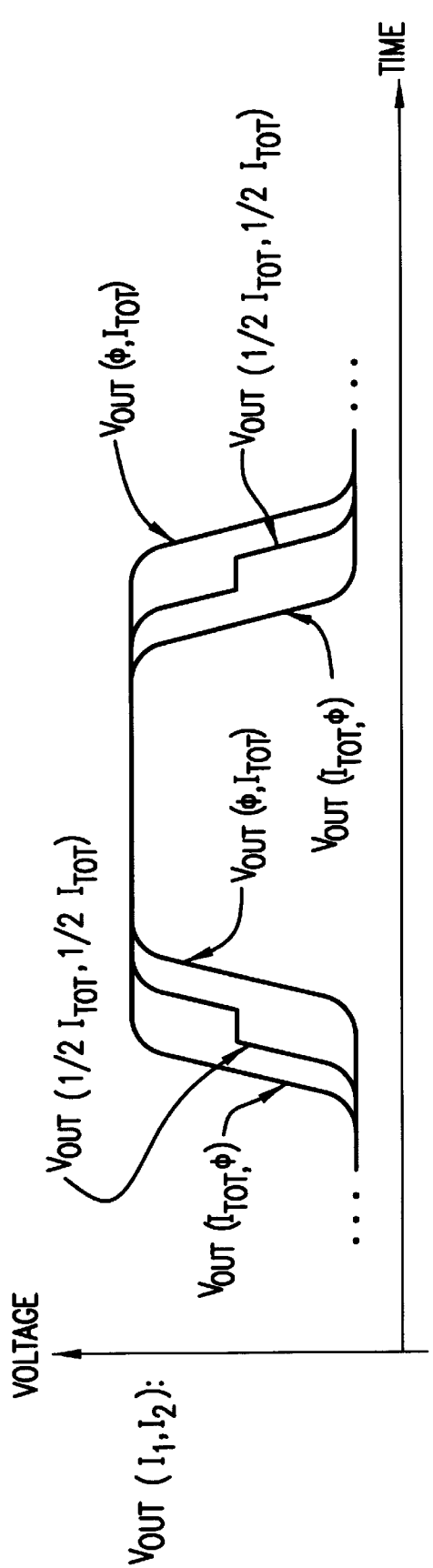

VARIABLE DELAY ELEMENT

FIELD OF THE INVENTION

The present invention relates to phase interpolation, and more specifically, to adjustable phase interpolation.

BACKGROUND

Differential phase interpolator circuits are used in a variety of electronic systems where they serve to produce an output signal with a desired phase. Phase interpolators typically receive two input signals which have the same frequency and different phases. The phase interpolator uses these two input signals to produce an output signal which has a phase that lies somewhere between the phases of the two input signals. In this manner, a phase interpolator circuit produces an output signal with a desired phase that lies between the phases of its two input signals. A phase interpolator circuit, in general, is useful wherever phase adjustment of an output signal is required and reference signals are available. For example, phase interpolators may be used in a synchronous memory system to adjust the phase of an internal clock in a memory device to match the phase of an external system clock.

FIG. 1 illustrates a prior art differential phase interpolator circuit, also known as a phase mixer circuit. The circuit comprises two transistors M1 120 and M2 125 which are connected sharing their source nodes to form a differential transistor pair. The circuit further includes transistors M3 130 and M4 135 which are also connected as a differential pair. Two load resistors R1 150 and R2 160 are coupled to the drains of transistors M1 120 & M3 130 and M2 125 & M4 135, respectively. The circuit also includes two variable tail current sources $I_1$ 110 and $I_2$ 140, coupled to the sources of differential pairs M1/M2 120 125 and M3/M4 130, 135, respectively. The total current that is sunk by the two current sources, $I_1$ 110 and $I_2$ 140, is a fixed quantity $I_{tot}$ such that $I_1+I_2=I_{tot}$ and $I_{tot}*R_1=V_s$, where $V_s$ is the desired output voltage swing. Depending on the required phase of the output signal (i.e. the interpolation between the two input signals), this total current $I_{tot}$ will be distributed appropriately between $I_1$ 110 and $I_2$ 140. For example, the distribution could be $I_1=0.3*I_{tot}$ and $I_2=0.7*I_{tot}$.

Under normal operation, the circuit receives two differential input signals, $V_{in1}$ and $V_{in2}$ that are applied to the inputs (i.e. gates) of the two differential pairs. The $V_{in1}$ and $V_{in2}$ signals have the same frequency but different phase. For example, $V_{in2}$ may lag $V_{in1}$ by 45 degrees. If all of the current is sunk through $I_1$, i.e. $I_1=I_{tot}$ and $I_2=0$, only $V_{in1}$ will contribute to the output signal. The resultant phase of the output signal will be determined only by the phase of $V_{in1}$. The phase of the output signal determined under these conditions is designated as $\emptyset_1$. Similarly, if all of the current is sunk through $I_2$, i.e. $I_1=0$ and $I_2=I_{tot}$, only $V_{in2}$ will contribute to the output signal. In that instance, the phase of the output signal will be determined only by the phase of $V_{in2}$. The phase of the output signal determined under these conditions is designated as $\emptyset_2$. If $V_{in2}$ lags $V_{in1}$ by X degrees, then $\emptyset_2-\emptyset_1=X$ degrees. If both current sources $I_1$ 110 and $I_2$ 140 are sinking some of the current, the output signal will be determined by both $V_{in1}$ and $V_{in2}$ Therefore, the phase of the resulting output signal will fall between $\emptyset_1$ and $\emptyset_2$. By properly distributing the total current between the two current sources $I_1$ 110 and $I_2$ 140, the output signal $V_{out}$ can be set to any phase between $\emptyset_1$ and $\emptyset_2$.

FIGS. 2A and 2B respectively illustrate input and output wave forms for the phase interpolator circuit under normal operating conditions. Output wave forms $V_{out}$ are shown for three interpolation conditions: $V_{out}(I_1, I_2)=V_{out}(I_{tot}, 0)$ 210; $V_{out}(I_1, I_2)=V_{out}(0.5*I_{tot}, 0.5*I_{tot})$ 220; and $V_{out}(I_1, I_2)=V_{out}(0, I_{tot})$ 230. Under normal operating conditions, the phase interpolator circuit produces relatively smooth transitions on its output waveforms 210, 220, 230. As current is gradually switched from $I_1$ 110 to $I_2$ 140, the phase of the output signal gradually moves from $\emptyset_1$ to $\emptyset_2$. Maintaining a linear relationship between a change in current and a corresponding change in output phase is advantageous. An ideal, linear, monotonic phase interpolation transfer function is illustrated in FIG. 4.

Given that the two input signals maintain a fixed phase relationship regardless of the operating frequency, one of the most significant limitations of the phase interpolator circuit is that it only works effectively over a relatively small frequency range. Its operation is limited at both high and low frequencies.

The phase interpolator circuit has an upper limit to its operating frequency range because as the operating frequency is increased, the circuit eventually can not produce a full swing output signal. As the operating frequency is then further increased, the output signal amplitude continues to decrease, since $I_{tot}$ cannot be switched sufficiently fast to discharge the capacitance on the output nodes within half a cycle. In other words, the upper frequency limit of the circuit is primarily determined by the dominant RC pole at the output nodes.

One prior art solution to this high frequency limitation is to design the circuit with smaller resistors as R and R2, while using a proportionately larger value of $I_{tot}$ This solution typically requires increasing the size of the transistors that make up the differential pairs. Additionally, while this solution solves the high frequency limitation, it limits circuit operation at lower frequencies. Therefore, although this design approach increases the upper frequency limit, it is not a good solution if the circuit needs to operate at low frequencies as well.

Additionally, increasing $I_{tot}$ increases the power used by the circuit, and increasing the size of the transistors increases the real estate required for the circuit. Additionally, at a certain point the output capacitance of the transistors dominates the other capacitances on the output nodes, and using a higher $I_{tot}$ and a correspondingly larger transistor does not extend the upper frequency limit. Thus, the high end of the operational frequency range of the phase interpolator circuit is limited by the value of R1 and R2, the value of $I_{tot}$, the total capacitance on the output nodes of the circuit, the transconductance of the transistors, and, ultimately, the $f_T$ of the transistors. The value of $f_T$ is determined primarily by the transistor technology used to implement the circuit.

As the signal frequency is decreased, the phase interpolator circuit also eventually ceases to operate properly, but for a different reason. As the signal frequency is decreased, while maintaining a fixed phase relationship between the two input signals, the rise and fall times of both the input and output signals increasingly becomes a smaller fraction of a cycle. Additionally, the time between a $V_{in1}$ voltage transition and a corresponding $V_{in2}$ voltage transition increases. As this occurs, the output wave form begins to display a shelf-like kink half-way through its low-to-high and/or high-to-low voltage transitions when the circuit is interpolating between the two input signals, as illustrated in FIGS. 3A and 3B.

These kinks in the voltage transitions occur because the differential pairs in the circuit switch their tail currents too quickly. In other words, $V_{in1}$ will make a full transition, thereby switching all of $I_1$'s 110 current from M1 120 to M2 125 (or vice-versa) before $V_{in2}$ begins its voltage transition. Because of the $V_{in1}$ transition, the output signal will switch half-way. However, since $V_{in2}$ has not yet begun its voltage transition, the output signal remains at this intermediate voltage until $V_{in2}$ transitions. Only then will $V_{out}$ complete its voltage transition. This "half-switching effect" produces the shelf- like kink as illustrated in FIG. 3B when $V_{out}(I_1, I_2) = V_{out}(0.5*I_{tot}, 0.5*I_{tot})$. When the output signal displays a shelf-like kink, the circuit produces an undesirable, non-linear, S-shaped phase interpolation transfer function, as shown in FIG. 5. Such a transfer function is undesirable because there ceases to be a linear correlation between a change in $I_1$ 110, or $I_2$ 140, current and a resulting change in output phase. The output phase becomes too sensitive to small changes in $I_1$ 110 or $I_2$ when the circuit is operating near $I_1=0.5*I_{tot}$. Conversely, the output phase becomes too insensitive to small changes in the current of $I_1$ 110 or $I_2$ when the circuit is operating near $I_1=I_{tot}$ or $I_1=0$. Additionally, the shelf-like transition makes the phase interpolator's output signal more susceptible to jitter, particularly when operating near $I_1=I_2=0.5*I_{tot}$.

SUMMARY OF THE INVENTION

It is an object of this invention to extend the range of frequencies over which a phase mixer circuit is usable.

It is an object of this invention to provide an adjustable phase interpolator circuit that functions in a linear manner over a range of frequencies.

It is also an object of this invention to provide an adjustable phase interpolator circuit that functions in a linear manner over an extended range of process, voltage, temperature, and sheet resistance conditions.

It is a further object of this invention to enable changing of the capacitance on the input and/or output nodes of a phase interpolator.

It is a further object of this invention to extend the delay generated by a variable delay generator while maintaining voltage swing.

The present invention is a phase interpolator circuit. The adjustable phase interpolator includes a phase interpolator circuit that has a voltage input and a voltage output. The adjustable phase interpolator further includes a controllable capacitive load coupled to either the input or the output of the phase interpolator circuit. The controllable capacitive load is designed to add or subtract capacitance to the adjustable phase interpolator.

Other objects, features, and advantages of the present invention will be apparent from the accompanying drawings and from the detailed description that follows below.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 3A and 3B are illustrations of typical input and output voltage signals of the phase interpolator circuit of FIG. 1 under low frequency operating conditions.

DETAILED DESCRIPTION

Figure 1:
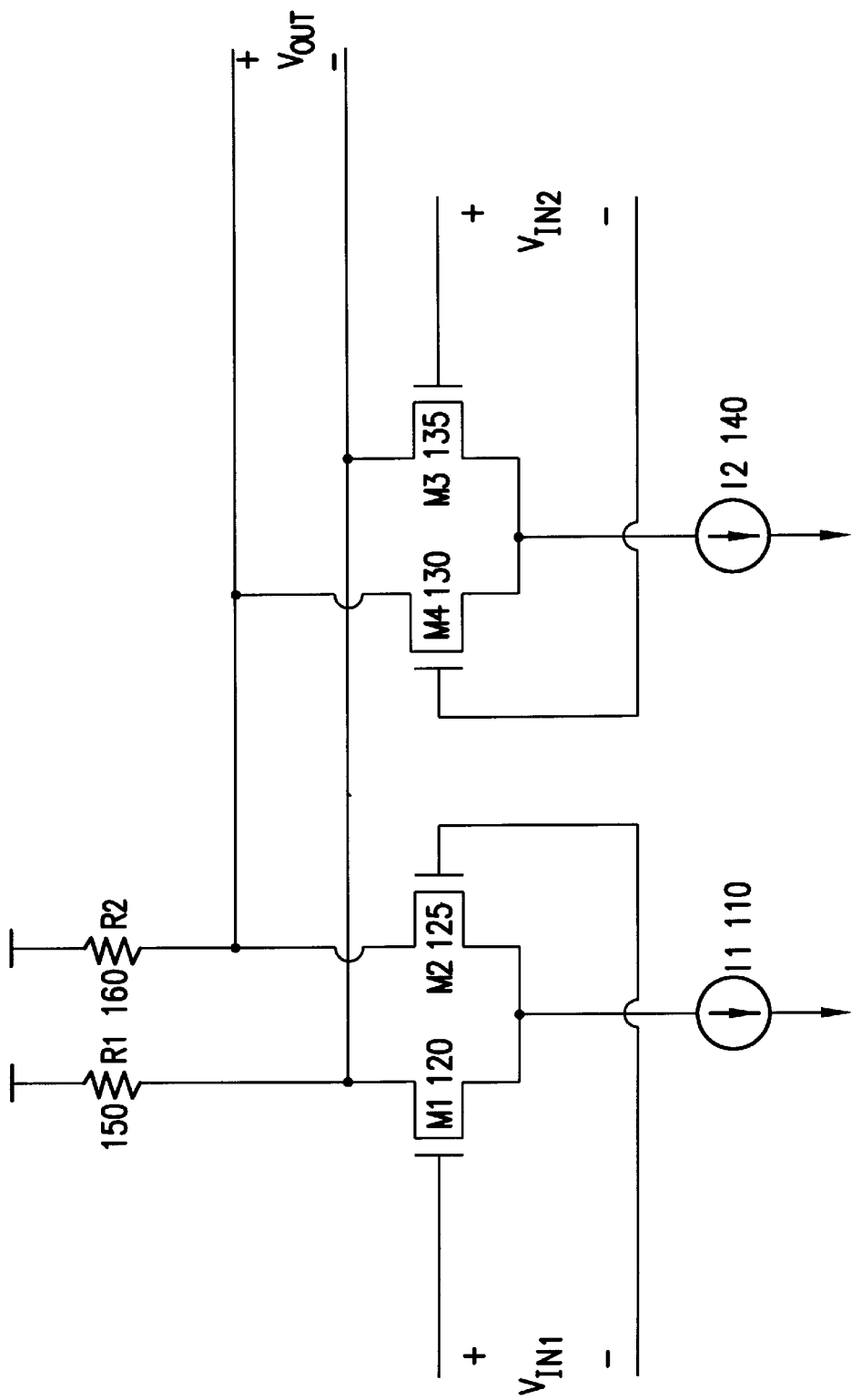
FIG. 1 is an illustration of a prior art phase interpolator circuit.
Figure 2A:
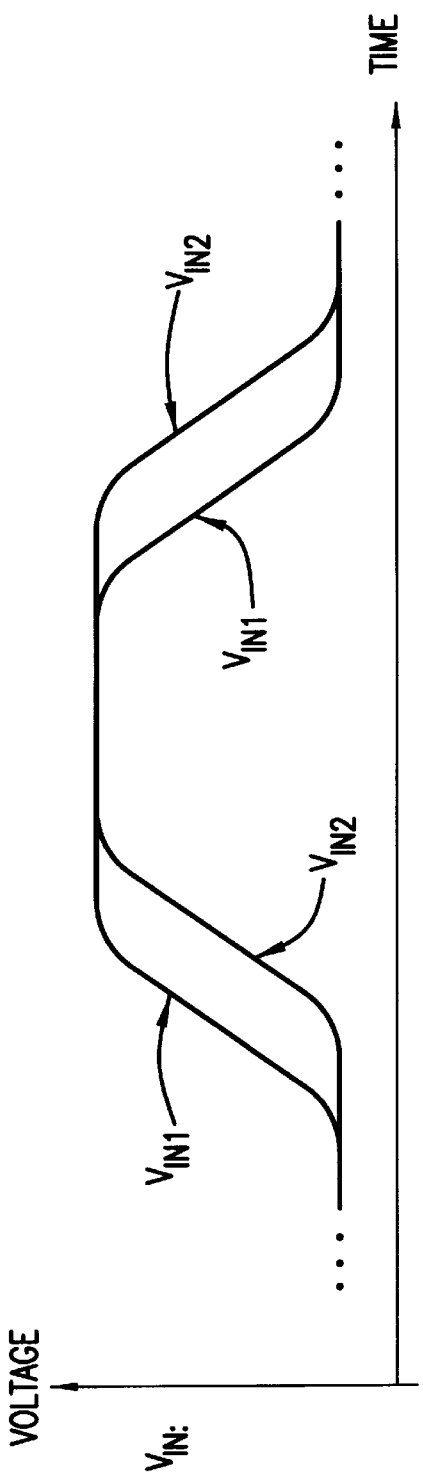
FIGS. 2A and 2B are illustrations of typical input and output voltage signals of the phase interpolator circuit of FIG. 1 under normal operating conditions.
Figure 2B:
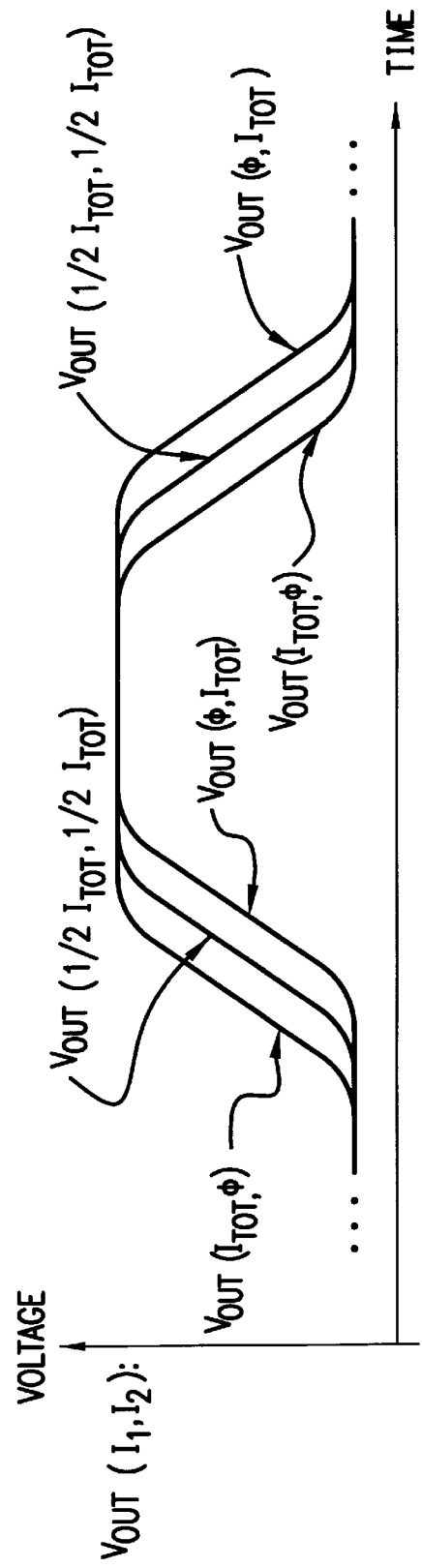
Figure 4:
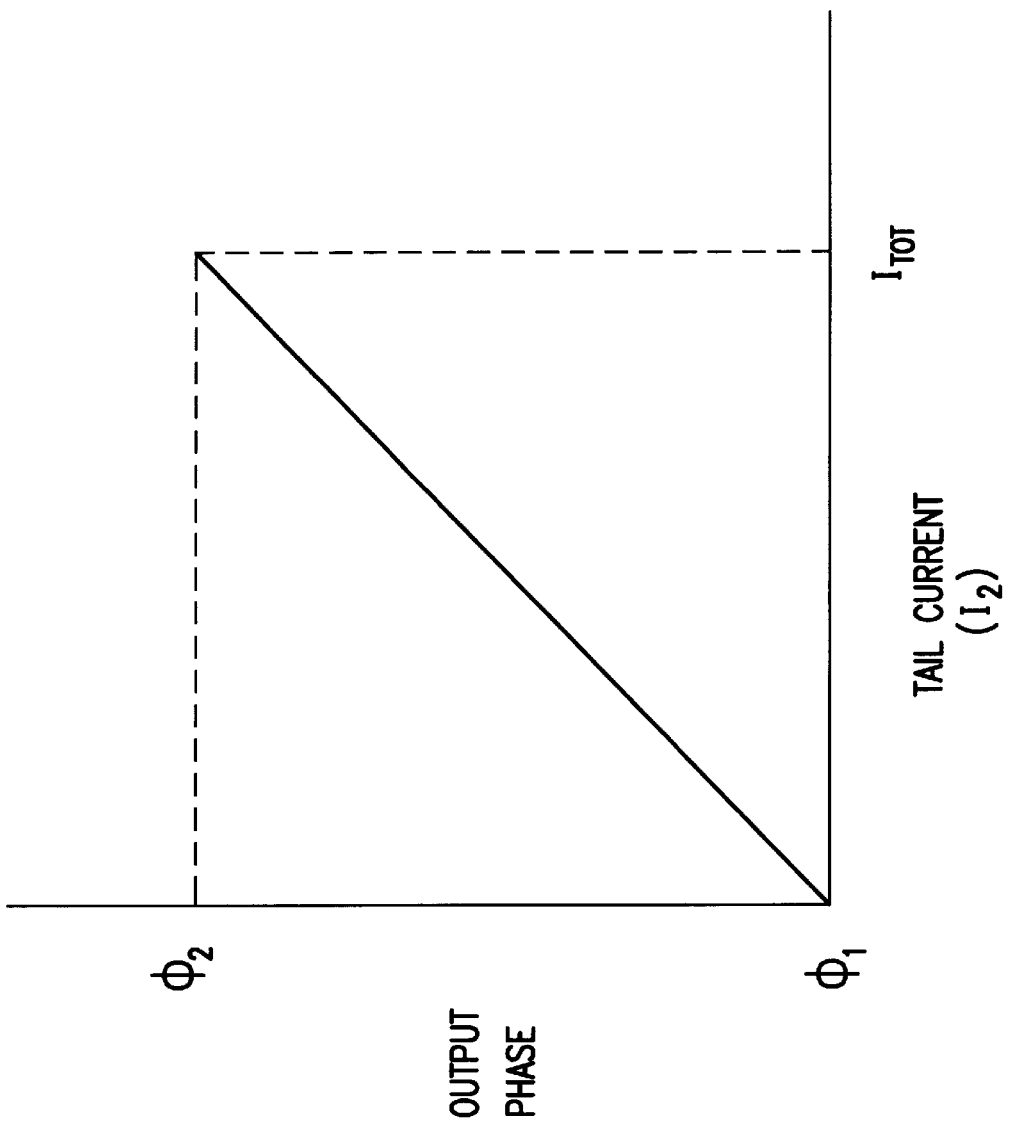
FIG. 4 is an illustration of an ideal, linear, monotonic phase interpolation transfer function illustrating the relationship between input current and output phase of the phase interpolator circuit of FIG. 1 under normal operating conditions.

A phase interpolator circuit which provides tunability of phase interpolation performance by using controllable capacitive loading is described. A phase interpolator circuit produces an output signal with a phase that lies somewhere between the phase of two input signals. Moving the RC time constants at the nodes of the phase interpolator extends the frequency range in which the phase interpolator may be used.

For one embodiment, controllable capacitive loading is applied or removed from the input and/or output nodes of a phase interpolator circuit to improve the phase interpolating operation of the circuit. Applying a proper amount of capacitive loading at these nodes insures that the circuit produces a linear phase interpolation transfer function while maintaining an unattenuated voltage swing at all the nodes in the circuit. Setting the proper capacitive loading at the nodes allows the circuit to operate effectively over different operating frequency ranges, thereby extending the range of frequencies over which the circuit can be used.

For an alternative embodiment, controllable resistive loading and controllable current sources are coupled to the phase interpolator circuit. Applying a proper amount of resistance and current produces a linear transfer function at lower frequencies. Setting the proper RC time constants of the nodes further allows the circuit to be adjusted such that it operates effectively as operating conditions, such as process, voltage, temperature, and sheet resistance, change.

The phase interpolator circuit may be used in a synchronous memory system including a master device that reads from and writes to memory devices using a memory channel. A synchronous memory system operates by sending and receiving data in packets which are synchronized with respect to a system clock; thus the name synchronous memory system. In order to do this properly, the memory master as well as all the slave devices must include circuitry that ensures that the data is read and written synchronously with the system clock. This circuitry is the clock recovery and alignment circuitry (CRA circuit) and it is placed within the interface circuits of the memory master and slave devices. The key function of the CRA circuitry is to produce internal clock signals within each device that maintain the proper phase relative to that of the external system clock, such that data read or written to the channel by each of the devices is done so at the correct time, thereby preserving synchronization in the memory system. The phase interpolator circuit is a part of the clock recovery and alignment circuitry. The phase of the output signal from the phase interpolator is actively set to achieve proper synchronization of the memory device with the system clock. Because conditions in the memory system such as temperature and voltage change over time, the performance of the phase interpolator should be controllable, such that it can be optimized for various conditions.

The phase interpolator is used within a larger, active circuit such as a PLL (phase-locked loop) or DLL (delay-locked loop) to continuously maintain timing synchronization to the system clock while the memory system is in use. Thus as operating conditions change, the interpolation position of the phase interpolator may change, i.e. its operating point will move along its phase interpolation transfer function. Therefore, a linear phase interpolation transfer function is desired so that the phase interpolator does not become more susceptible to jitter at certain points in the transfer function.

Furthermore, the phase interpolator may be used in different systems which use different operating frequencies. The phase interpolator should be adjustable to operate effectively at any required system clock frequency. Thus, by enabling this type of adjustablility, the phase interpolator maintains a linear phase interpolation transfer function over a large range of possible system clock frequencies.

Figure 6:
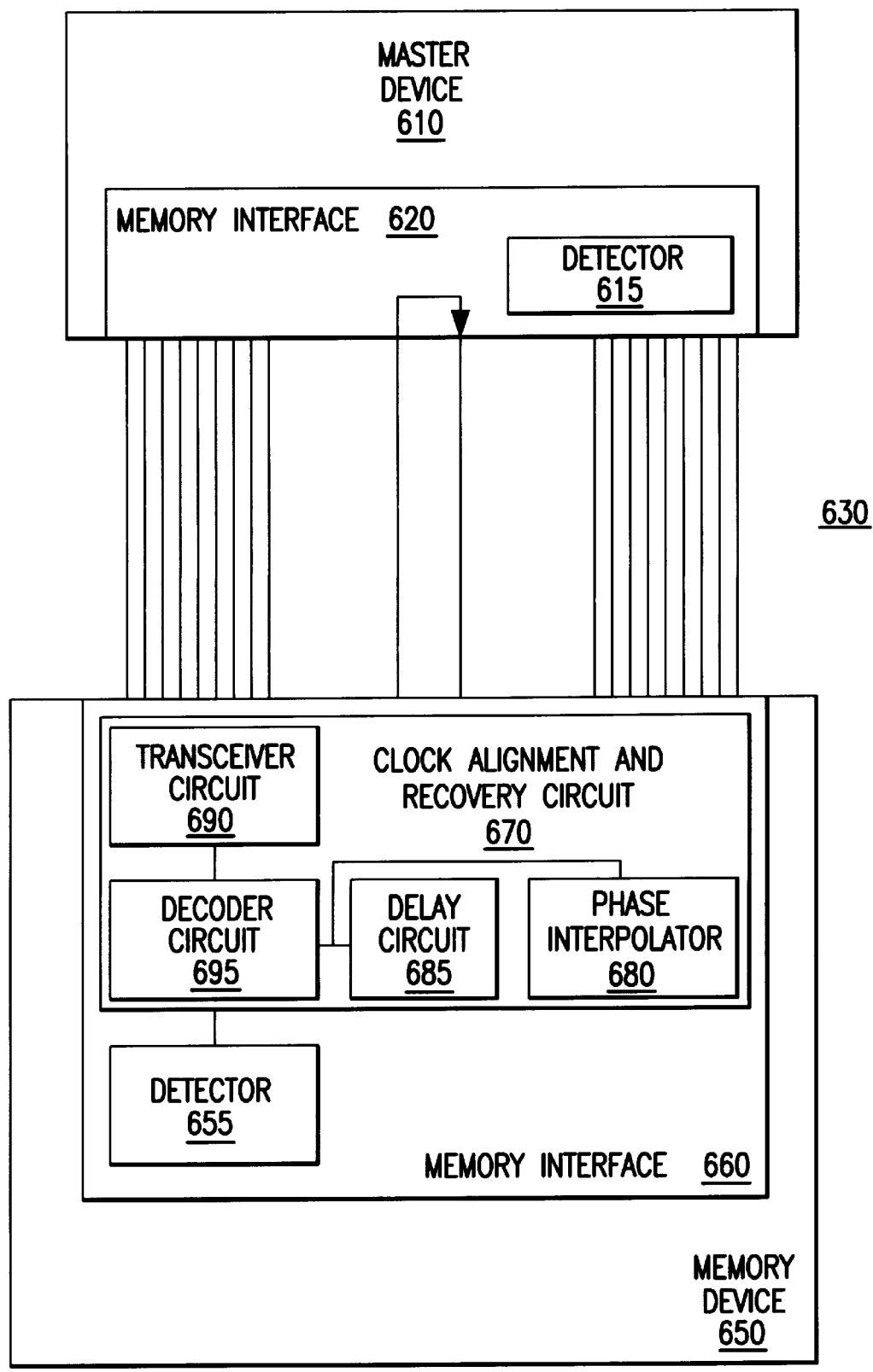
FIG. 6 is an illustration of one embodiment of a circuit in which the phase interpolator circuit of the present invention may be implemented.

FIG. 6 illustrates one embodiment of a system in which the phase interpolator circuit and adjustable delay circuit may be used. The phase interpolator circuit may be used in a memory system including a master device 610 that reads from and writes to a memory device 650 using a memory channel 630. Both the master device 610 and the memory device 650 have a memory interface 620, 660, respectively. The memory interfaces 620, 660 are to interface with the memory channel 630.

The memory system is a synchronous memory system wherein the master device 610 has information about its operating frequency and transmits this frequency information to the memory device 650. For one embodiment, the master device receives the memory system's clock frequency, holds this frequency information, and then communicates it to the slave device(s). For another embodiment, the memory device 650 first determines the frequency information, and then transmits it to the slave devices. The memory device 650 then uses this frequency information to adjust the clock recovery and alignment circuit 670 in its memory interface 660 in order to improve the performance at the system clock frequency.

The memory interface 660 of the memory device 650 includes CRA circuit 670 to adjust the phase of the internal clocks of the memory device 650 to match the phase of an external system clock that is shared by the entire memory system. For one embodiment, the CRA circuit 670 includes a transceiver circuit 690, a decoder circuit 695, a delay element 685, and a phase interpolator 680.

The frequency information transmitted by the master device 610 is received by the transceiver 690. For one embodiment, the master device 610 sends the frequency information over a single channel that operates first at low speed to send frequency control information and then operates at high speed after adjustment. For another embodiment, the master device 610 sends the information over one channel that always operates at high speed, but until the frequency control information has been sent, it operates with lower initial margin. Alternatively, a separate channel may be used to send frequency information from the master device 610 to the slave devices.

The frequency information received by the transceiver 690 is transferred to the decoder circuit 695. The decoder circuit 695 transforms the frequency information into control codes for the phase interpolator 680 and/or the delay element. The delay circuit 685 generates a delayed clock signal input to the phase interpolator 680. The control codes adjust the interpolation performance of the phase interpolator circuit(s) in the memory device 650, as is described below.

For one embodiment, the master device 610 includes a detector 615. For one embodiment, the detector 615, may be a process, voltage, temperature, sheet resistance (PVTR) detector. The design of PVTR detectors are known in the art. Alternatively, the detector 615 may include a detector and decoder scheme that produces the control signals by considering any combination of frequency, PVTR, or other information that affects the ability of the circuit to interpolate correctly, i.e. linearly, between the two input signals. For one embodiment, the memory device 650 also includes a detector 655.

For one embodiment, only the master has a PVTR detector 615 or other detector 615 for detecting system operating conditions and sends this information to the slave devices so that they can adjust their performance. The data from the detector 615 may be sent via any of the channels used for sending frequency information, as described above. For another embodiment, each individual slave device 650 has a PVTR detector 655 to control the performance of its own phase interpolator circuits. For a third embodiment, the master 610 includes a detector 615 and sends frequency information to the slaves 650, but each slave 650 also has its own PVTR detector 655. The frequency data is combined with the PVTR data to properly adjust the phase interpolator to account for both of these two types of operating information.

FIG. 6 illustrates only one exemplary use of the phase interpolator. It is to be understood that the phase interpolator circuit may be used in different systems, such as microprocessors, audio circuits, test access ports, communications circuits etc. For more information on adjusting the performance of synchronous memory systems, please refer to the concurrently filed and commonly assigned patent application Ser. No. 08/948,774, entitled "Method and Apparatus for Adjusting the Performance of a Synchronous Memory System filed Oct. 10, 1997."

Figure 7:
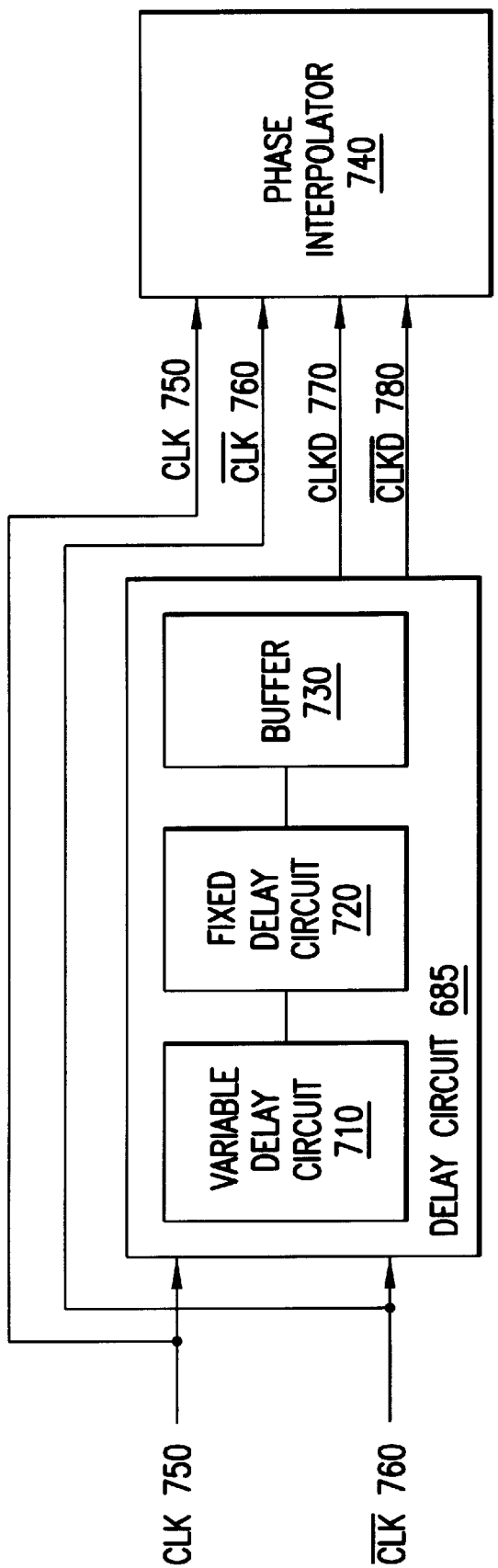
FIG. 7 is a block diagram of a delay element including a phase interpolator and an adjustable delay circuit for generating input signals for the phase interpolator.

FIG. 7 is a block diagram of a delay element including a phase interpolator and a delay circuit generating input signals for the phase interpolator. Clock signal (Clk) 750 and its complement (Clk) 760 are applied to delay circuit 685. The delay circuit 685 generates delayed clock signal (Clk) 770 and its complement (Clk) 780. Both sets of clock signals including Clk 750, Clk 760, and Clk 770, Clk 780 are applied to phase interpolator 740. The phase interpolator circuit 740 generates an output having a phase between the phases of clk 750 and clkd 770.

For one embodiment, the delay circuit 685 includes a variable delay element 710, a fixed delay element 720, and a buffer 730. Although only one variable delay element 710 is illustrated, a number of variable delay elements 710 may be included in the delay circuit 685.

Figure 8:
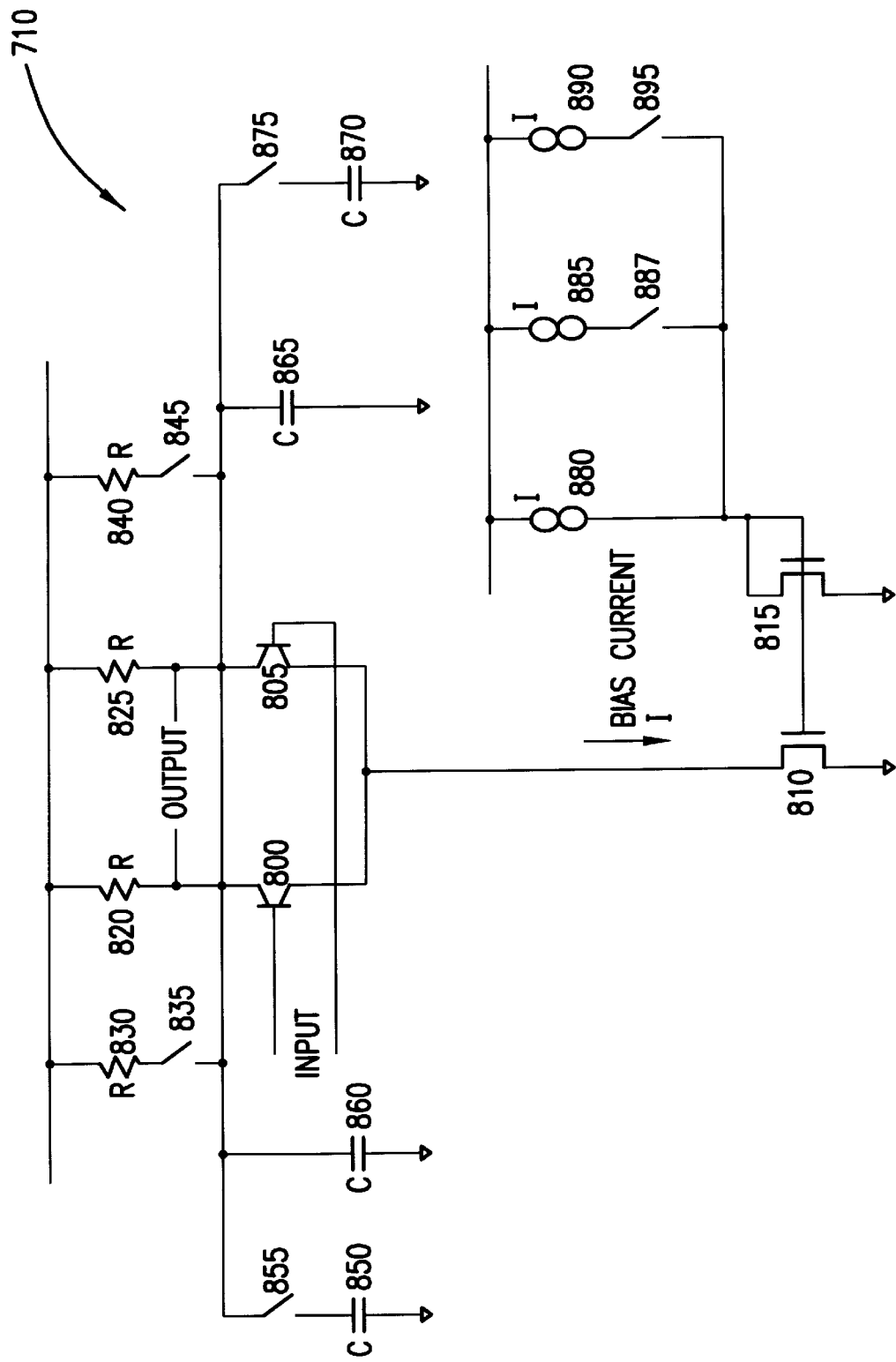
FIG. 8 is one embodiment of a variable delay circuit of the present invention.

FIG. 8 illustrates one embodiment of the variable delay circuit 710 which may be used in the present invention. The inputs to the variable delay element 710 is input to the gates of two NMOSFETs 800, 805 coupled as a differential pair. The drains of the NMOSFETs 800, 805 are coupled via resistors 820 and 825, respectively, to Vdd. Resistors 830 and 840 are coupled in parallel with resistors 820 and 825. Resistor 830 is coupled to the drain of NMOSFET 800 via switch 835. Resistor 840 is coupled to the drain of NMOSFET 805 via switch 845. In this way, resistors 830 and 840 may be switched into and out of the circuit.

Capacitors 860, 850 are coupled between ground and the drain of the NMOSFET 800. One of the capacitors 850 is coupled to the drain of the NMOSFET 800 via a switch 855. The capacitor 850 can be switched into and out of the circuit 610. Similarly, capacitors 865 and 870 are coupled between ground and the drain of the NMOSFET 805, in parallel. Capacitor 870 is coupled via switch 875.

The sources of NMOSFET 800 and NMOSFET 805 are coupled together and coupled to the drain of NMOSFET 810. The source of NMOSFET 810 is coupled to ground. NMOSFET 815 is coupled in parallel with NMOSFET 810, having its source coupled to ground. The gates of both NMOSFET 810 and NMOSFET 815 are coupled to current source 880. Furthermore, the drain of NMOSFET 815 is coupled to the current source 880. Additionally, current sources 885 and 890 are coupled in parallel with current source 880, through switches 887 and 895, respectively. In this way, current sources 885 and 890 may be coupled into and out of the circuit.

By selectively including some of the resistors 830, 840, capacitors 850, 870, and/or current sources 885, 890 the desired delay is generated while maintaining the output swing. The different frequency ranges are therefore selected by switching in the appropriate elements. Switching in these elements, resistors, capacitors, and/or current sources, changes the RC time constants of the circuits. Increasing the delay allows the delay element to operate at lower frequencies. For one embodiment, the switching in of these elements is controlled by control codes from the decoder 695. Note that although two each of the resistors, capacitors, and current sources are illustrated, fewer or more of each element may be included in the delay circuit 610.

Figure 9:
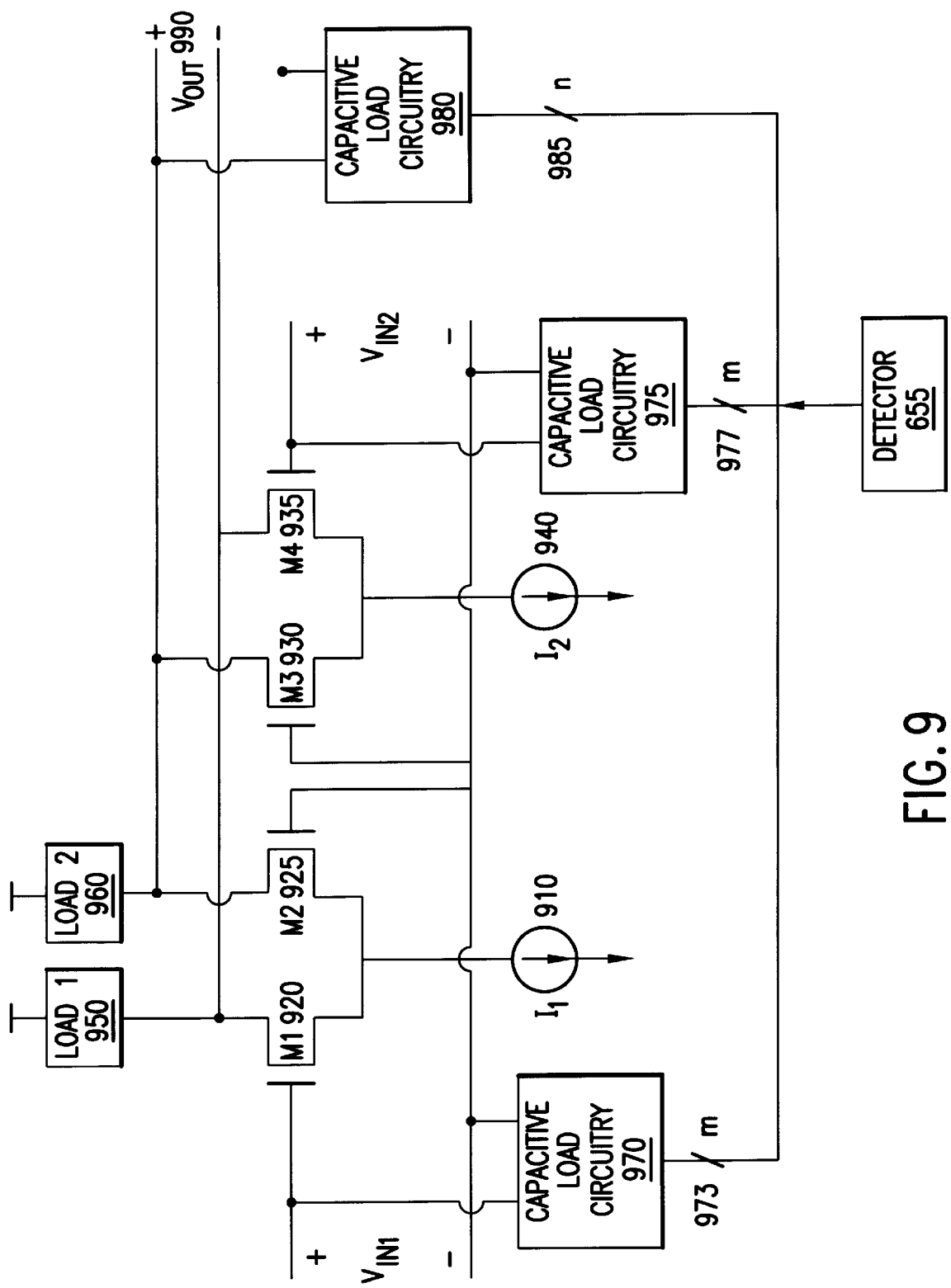
FIG. 9 is an illustration of one embodiment of an improved phase interpolator circuit including capacitive loads according to the present invention.

FIG. 9 illustrates an improved phase interpolator circuit according to one embodiment of the present invention. The phase interpolator includes two differential transistor pairs, M1 920/M2 925, and M3 930/M4 935. The circuit further includes two variable tail current sources $I_1$ 910 and $I_2$ 940. Finally, the circuit includes two loads Load1 950 and Load2 960. For one embodiment, the loads 950, 960 are resistors. Alternatively, the loads 950, 960 are implemented with active loads such as diode-connected N-MOSFETs or P-MOSFETs with grounded gates. Although the differential pairs 920, 925, 930, and 935 are shown using N-MOSFETs, they could alternatively be implemented with BJTs, P-MOSFETs, MESFETs, or other transistor devices, as is well understood in the art. The circuit further includes three controllable capacitive load blocks 970, 975, 780. Each of the controllable capacitive load blocks 970, 975, 980 has two output nodes, A and B. The three controllable capacitive load blocks 970, 975, 980 are coupled to the $V_{in1}$ and $V_{in2}$ input nodes, and the $V_{out}$ output node of the phase interpolator circuit, respectively.

The controllable capacitive load blocks 970, 975, 980 provide a controllable amount of capacitance at their output nodes. The capacitance provided by the controllable capacitive load blocks 970, 975, 980 are set by the control signals or control codes applied to the blocks via their control lines, m and n. For one embodiment, both capacitive load blocks 970, 975 coupled to the $V_{in1}$ and $V_{in2}$ input nodes have m control lines. The capacitive load block 980 coupled to the $V_{out}$ node 990 has n control lines. For one embodiment, m=n and the same control signals are applied to all three of the controllable capacitive load blocks 970, 975, 980. For an alternative embodiment, one set of m control lines control the two controllable capacitive load blocks 970, 975 that connect to the inputs of the phase interpolator circuit, while a separate set of n control lines control the controllable capacitive load block 980 connected to the outputs of the phase interpolator circuit.

For one embodiment, digital signals are applied to these control lines to specify the amount of capacitance that should be provided by the controllable capacitive load blocks 970, 975, 980. For one embodiment, digital signals are CMOS rail-to-rail signals. When digital signals are used for control, capacitance can be added or removed only in discrete quantities according to the applied digital code. Alternatively, analog signals may be used to control the capacitance of the capacitive load blocks 970, 975, 980 with finer resolution.

All three controllable capacitive load blocks 970, 975, 980 need not be used. For an alternative embodiment, capacitive loading 980 is added only at the output nodes. For one embodiment, additional capacitive loading 970, 975 is added only at the input nodes. Whenever capacitive loading is added at the input nodes the same capacitive load should be added to both input ports to keep the two input signals balanced. If capacitive loading is added at both the inputs and the outputs, both input loads should be equal, but the output load does not have to be the same as the input load.

Figure 5:
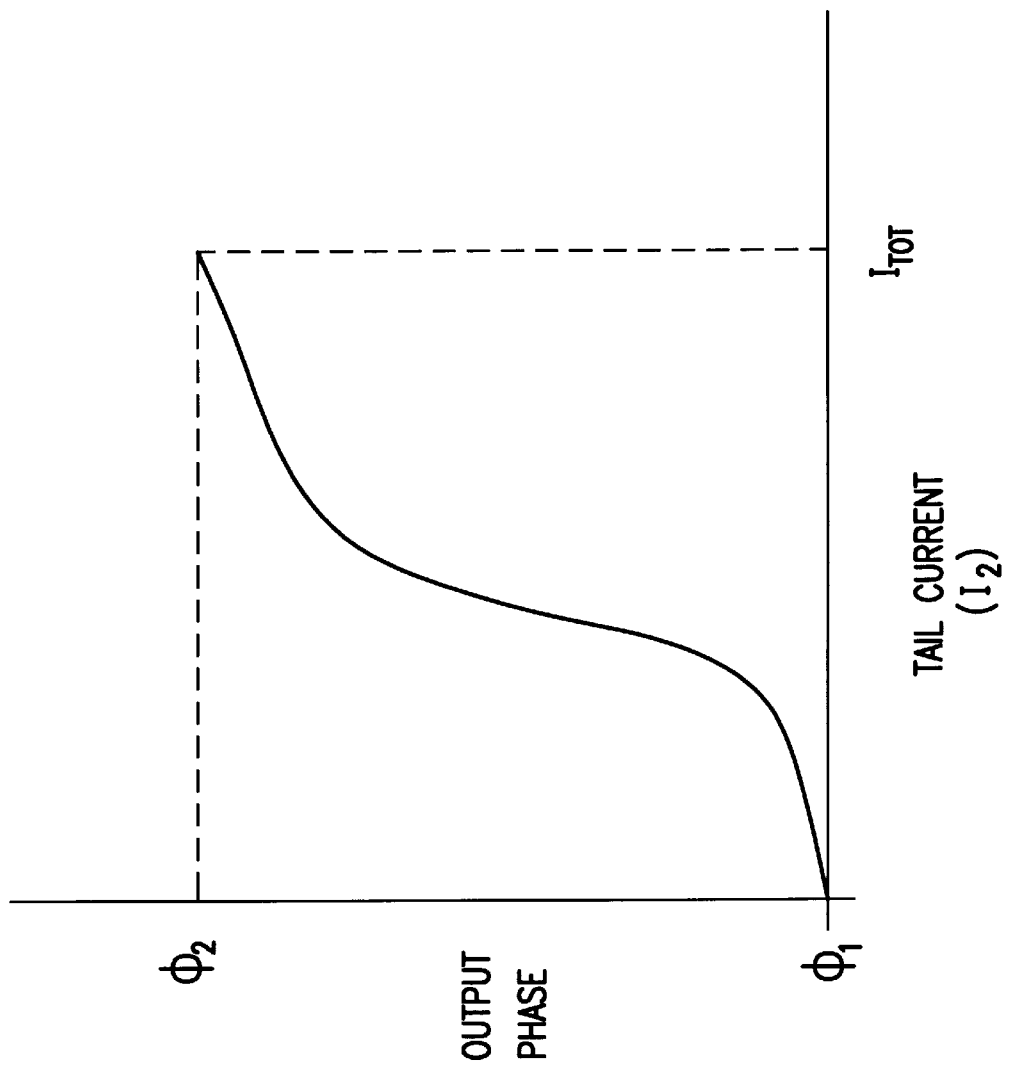
FIG. 5 is an illustration of an undesirable, non-linear phase interpolation transfer function illustrating the relationship between input current and output phase of the phase interpolator circuit of FIG. 1 under low frequency operating conditions.

Adding capacitive load blocks 970, 975 and/or 980 to the circuit improves the linearity of the phase interpolator's phase interpolation transfer function at lower frequencies. The increased capacitance slows down the edge rates of the signal transitions, thereby eliminating the step in the voltage transitions, and eliminating the S-shape of the transfer function, illustrated in FIG. 5. In other words, the added capacitance decreases the value of the dominant RC poles in the circuit, making the circuit unable to react as quickly to changes in the input waveforms. Therefore, the resulting output waveforms are smoother, making the transfer function more linear. Slowing down either the input signal edge rates or the output signal edge rates improves the linearity of the phase interpolator circuit's phase interpolation transfer function at low operating frequencies. However, it is preferred to simultaneously add additional capacitance to both the input and output nodes such that the input and output edge rates may be kept approximately equal as additional capacitive loading is added or removed from the circuit to extend its operating frequency range.

As additional capacitive loading is added to enable the phase interpolator circuit to operate effectively at lower frequencies, the circuit becomes unable to operate effectively at the higher frequencies that functioned before the additional capacitance was added. As additional capacitive loading is added at the inputs and/or output, the signal swing at the inputs and/or output collapses at high frequencies. Thus, for each capacitive load setting, there is a bounded operating frequency range over which the circuit operates effectively.

As an example, the phase interpolator circuit has control signals m=n=3. The following control codes and corresponding effective operating frequency ranges may be used, where m=n=C2C1C0:

TABLE 1

Frequency Range v. Control Codes

| Control Bits | | | Minimum Frequency | Maximum Frequency | Frequency Range |
|---|---|---|---|---|---|
| C2 | C1 | C0 | ($F_{min}$) | ($F_{max}$) | ($\Delta F$) |
| 0 | 0 | 0 | 238 MHz | 282 MHz | 44 MHz |
| 0 | 0 | 1 | 278 MHz | 327 MHz | 49 MHz |
| 0 | 1 | 1 | 323 MHz | 382 MHz | 59 MHz |
| 1 | 1 | 1 | 378 MHz | 447 MHz | 69 MHz |

For one embodiment, the ranges overlap one another. Without overlapping frequency ranges, there may be some ambiguity in deciding which capacitance setting should be used when operating the circuit at a frequency that serves as a boundary between two frequency ranges. Also, in this implementation a "thermometer" digital code was used. With this coding scheme, additional capacitance is added by successively changing one control bit at a time from a high (1) to a low (0) value, thereby successively decreasing the effective operating frequency range of the circuit. Alternatively, other coding schemes such as a standard binary code could be used to control the capacitive loading.

The phase interpolator may be used to adjust the linearity of phase interpolation over a large frequency range. However, factors such as supply voltage, temperature, process, sheet resistance, etc. can also affect the operation of the phase interpolator circuit and affect the linearity of its phase interpolation transfer function. Any or all of these factors can affect the edge rates of the input or output signals in the circuit. Therefore, any of these factors could cause the circuit to produce a shelf-like kink in its output voltage transitions, resulting in a non-linear phase interpolation transfer function. Alternatively, any of these factors could slow the circuit down and cause an attenuation of the output signal. Therefore, the concept of adding or removing capacitive loading at the inputs and/or outputs of the circuit to improve the circuit's performance, i.e. interpolation linearity, can also be used to fine-tune the operation of the phase interpolator circuit when its performance is affected by these other factors. For one embodiment, a detector 655 may be directly coupled to the phase interpolator circuit to generate the control signals m and n. The control signals that control the capacitance produced by the controllable capacitive load blocks are driven by the detector 655.

Figure 10:
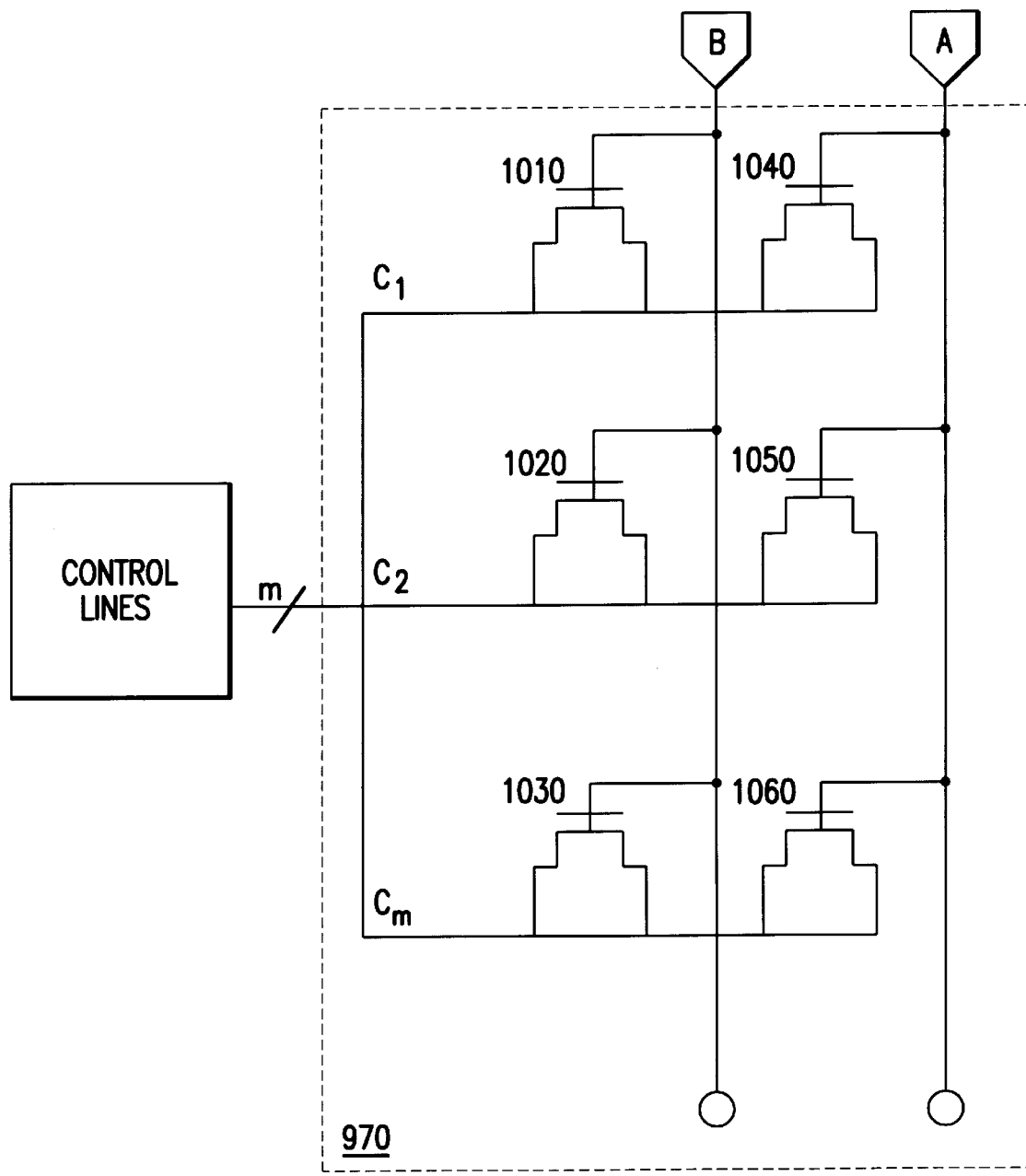
FIG. 10 is an illustration of one embodiment of the controllable capacitive loads of the circuit illustrated in FIG. 9.

There are a number of ways to implement the controllable capacitive load blocks 970, 975, 980. FIG. 10 shows one embodiment of a controllable capacitive load circuit 970 that uses a plurality of N-type metal oxide semiconductor field effect transistors (NMOSFETs) 1010, 1020, 1030, 1040, 1050, and 1060 as variable capacitance elements. Note that only three pairs of NMOS devices are used, in this example. Alternatively, the number of NMOS devices may vary.

When the control lines are held at a high voltage, for example at the voltage rail, the N-MOSFETs 1010, 1020, 1030, 1040, 1050, and 1060 are biased in depletion mode. Under such conditions the N-MOSFETs 1010, 1020, 1030, 1040, 1050, and 1060 present relatively little capacitance at their gate nodes. The capacitance the N-MOSFETs 1010, 1020, 1030, 1040, 1050, and 1060 exhibit at their gate nodes is due to the sum of the gate overlap capacitance and a negligibly small amount of depleted substrate capacitance. When the control lines are then switched to a low voltage, approximately ground, the NMOSFETs 1010, 1020, 1030, 1040, 1050, and 1060 are biased into strong inversion. Under such conditions the NMOSFETs 1010, 1020, 1030, 1040, 1050, and 1060 present a relatively large capacitance at their gate nodes. This capacitance is a sum of the gate overlap capacitance and the active-channel capacitance. For one embodiment the active-channel capacitance is significantly larger than the gate overlap capacitance. Thus, by successively lowering the control signals from the supply voltage to ground, the amount of capacitance at nodes A and B can be increased.

Figure 11:
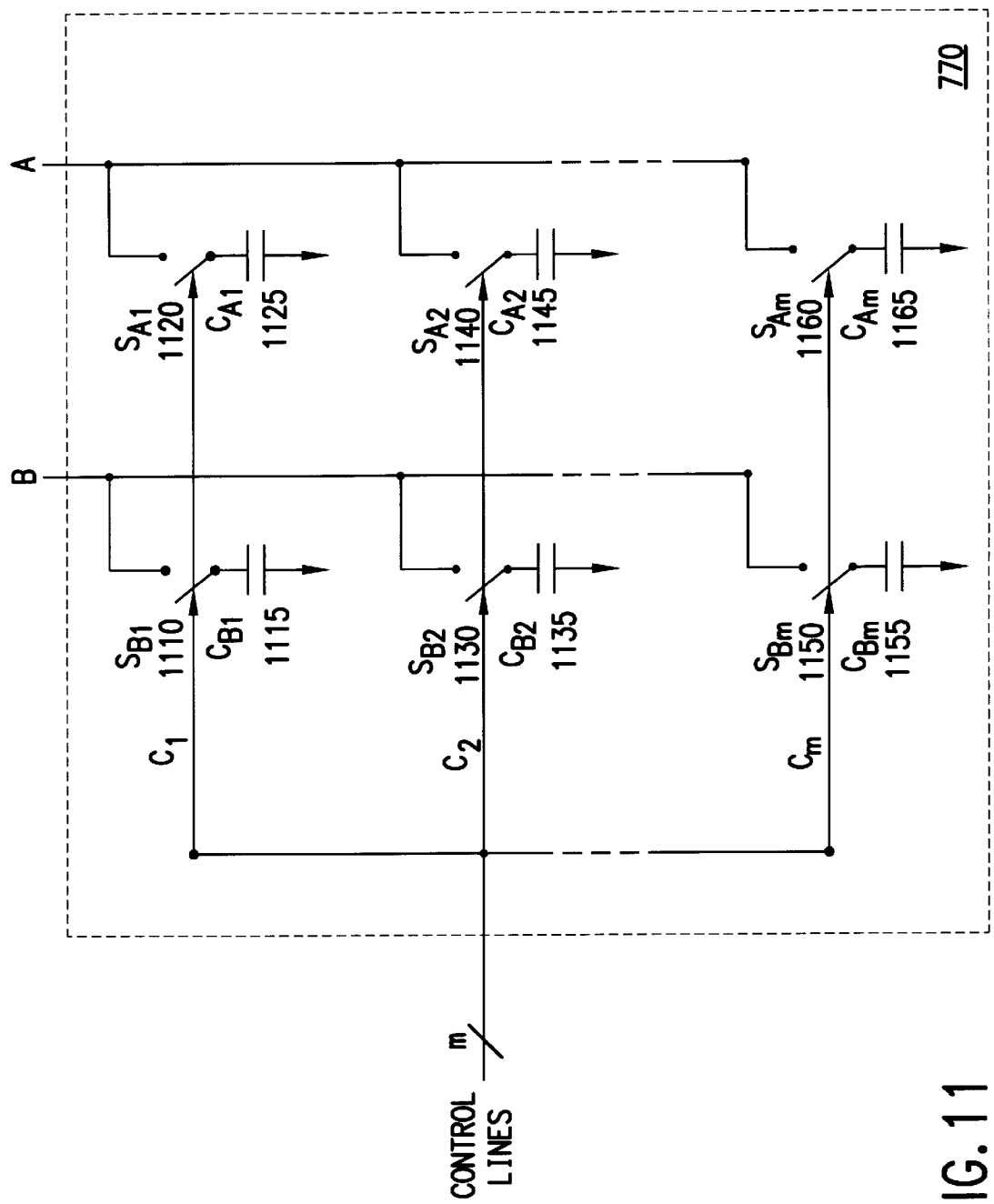
FIG. 11 is an illustration of an alternative embodiment of the controllable capacitive loads of the circuit illustrated in FIG. 9.

FIG. 11 illustrates an alternative embodiment of the controllable capacitive load blocks. In this implementation, the digital control signals are used to control switches (S1A, S2A, . . . SmA, S1B, S2B, . . . SmB) that connect or disconnect individual capacitors (C1A, C2A, . . . CmA, CB1, C2B, . . . CmB) to the A and B nodes. There are several possible ways to implement the switches, including NMOSFETs, PMOSFETs, or MOSFET transmission gates. There are also several ways to implement the individual capacitors such as N-MOSFET capacitors, P-MOSFET capacitors, metal1/metal2 capacitors, etc. These methods of implementing switches and capacitors are known in the art. Other types of controllable capacitive load blocks may be used to supply the additional, controllable capacitive loading to the phase interpolator circuit without departing from the spirit or scope of the invention.

Figure 12:
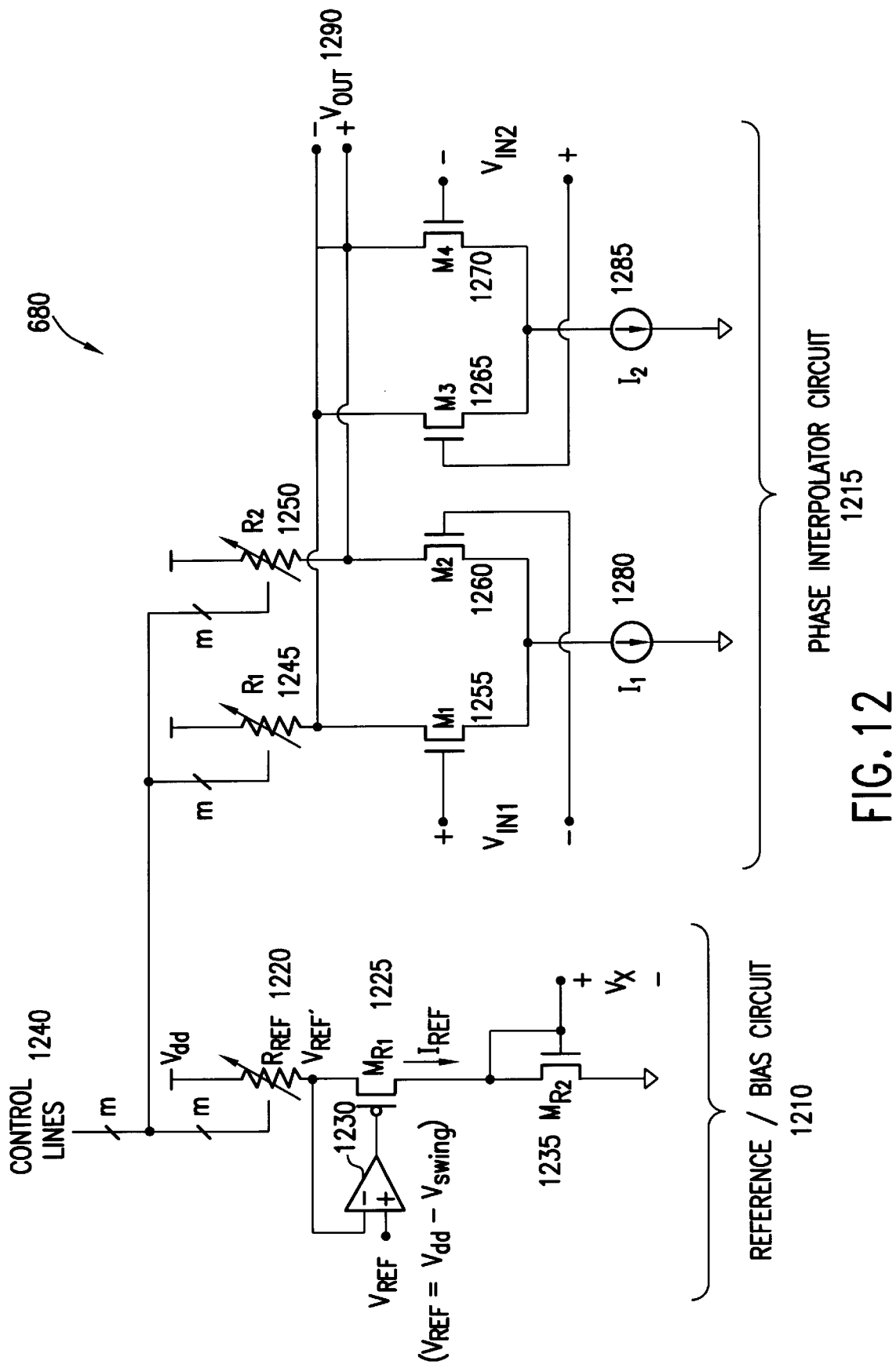
FIG. 12 is an illustration another embodiment of an improved phase interpolator circuit including variable loads according to the present invention.

FIG. 12 is an alternative embodiment of the phase interpolator of the present invention. The values of resistance (R) and current (Itot) are adjusted to maintain a desired output voltage swing. Simultaneous adjustment of R and $I_{tot}$ improves the interpolator performance at low frequencies while maintaining the desired voltage swing.

This embodiment has two essential parts: a reference/bias circuit 1210 and a phase interpolator circuit 1215. Both of these circuits have variable or selectable resistive loads 1220, 1245, 1250 whose resistance is controlled by the same m control lines.

One embodiment of the reference/bias circuit 1210 is illustrated in FIG. 12. The reference/bias circuit 1210 includes an operational amplifier 1230 (op amp) coupled to the gate of a PMOS MR1 1225. The inverting input of the op amp 1230 is coupled to the source of PMOS MR1 1225. The non-inverting input of the op amp 1230 has Vref as an input. The PMOS MR1 1225 is coupled to the positive power supply Vdd, via variable resistance Rref 1220. The variable resistance Rref 1220 is controlled by control lines 1240. The drain of PMOS MR1 1225 is coupled to a gate and drain of NMOS MR2 1235. The source of NMOS MR2 1235 is coupled to ground.

The reference/bias circuit 1210 establishes a reference current Iref which is determined by (Vdd−Vref)=Iref*Rref. The voltage Vref is at the source of PMOS MR1 1225, coupled to Rref 1220. Thus, this reference current is directly dependent on the value of Rref 1220, since Vref is held constant, and close to Vref, by the op amp 1230. This reference current Iref is used to control current sources I1 1280 and I2 1285 in the phase interpolator circuit 1215.

Current sources I1 1280 and I2 1285 are set such that Itot=I1+I2=k*Iref, where k is a multiplier. The use of a reference current to set the currents of other current sources is well understood in the art. Alternate bias circuits 1210 are known in the art, and may be used. The main function of reference circuit 1210 is to force a substantially fixed voltage across the variable reference resistance, Rref, to develop of reference current, Iref. The reference circuit 1210 further maintains the relationship I1+I2=k*Iref.

The phase interpolator circuit 1215 includes two differential transistor pairs, M1 1255/M2 1260, and M3 1265/M4 1270. The circuit further includes two variable tail current sources I$_1$ 1280 and I$_2$ 1285. Finally, the circuit includes two variable resistors R1 1245 and R1 1250. The variable resistors, R1 1245 and R2 1250, are controlled by control lines 1240. Although the differential pairs 1255, 1260, 1265, 1270 are shown using N-MOSFETs, they could alternatively be implemented with BjTs, P-MOSFETs, or other transistor devices, as is well understood in the art.

In the phase interpolator circuit 1215, load resistances R1 1245 and R2 1250 are designed such that their resistance is maintained at (y*Rref)/k, wherein y is a constant. The output voltage from the interpolator 1215, Vswing 1290, can be described by Vswing=R1*Itot=R2*Itot=(y*Rref/k)* (k*Iref)=y*Rref*Iref=y*(Vdd−Vref'). This configuration ensures that the output voltage swing is maintained at Vswing=y*(Vdd−Vref') regardless of the resistance selected. Selecting different resistances simultaneously and proportionately changes the values of Rref, R1, R2, and Itot, maintaining this relationship. Adjusting the values of Rref, R1, R2, and Itot changes the value of the dominant RC pole at the output nodes of the phase interpolator circuit 1215. By simultaneously increasing the values of Rref, R1 and R2 and decreasing the value of Itot, the circuit achieves a more linear interpolation transfer function at lower frequencies while maintaining the same output voltage swing. When a high resistance is selected, the dominant RC pole moves down in frequency, lowering the usable operating frequency range of the circuit.

Figure 13:
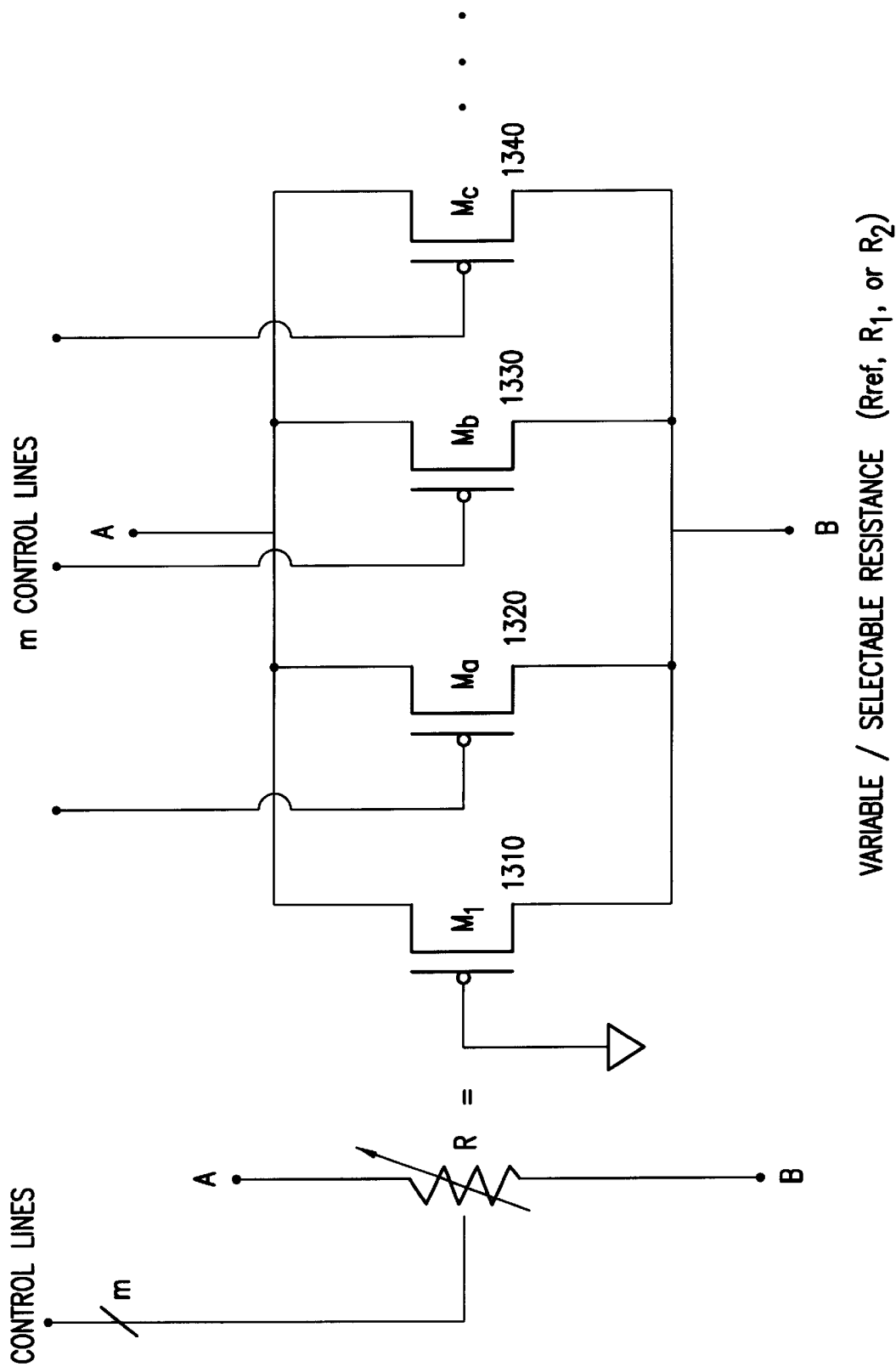
FIG. 13 is an illustration of one embodiment of the variable loads of the circuit illustrated in FIG. 12.

FIG. 13 is one embodiment of a variable resistive load, R1, R2, or Rref, according to the present invention. The circuit is a bank of PMOS devices 1310, 1320, 1330, 1340 coupled in parallel, which function as resistors. When all the control lines are held high, at Vdd, only transistor M1 1310 is turned on, so the circuit will have its highest resistance. As the control line voltages for each of the PMOS devices 1320, 130, and 1340 is lowered to ground, its corresponding PMOS device 1320, 1330, 1340 is turned on, effectively adding resistance in shunt with M1 and lowering the overall resistance seen across the terminals of the bank of resistors. In order to ensure that R1=R2=y*(Rref/k), for one embodiment, each of the resistors in the bank used for R1 and the bank used for R2 is k/y times as wide as the resistors in the bank used for Rref. Also, the same m control lines simultaneously control all three banks of resistors. Alternative implementations of a variable resistive load are known in the art.

In the foregoing specification, the invention has been described with reference to specific exemplary embodiments. It will, however, be evident that various modifications and changes may be made without departing from the broader spirit and scope of the invention as set forth in the claims. The specification and drawings are, accordingly, to be regarded in an illustrative rather than a restrictive sense.

What is claimed is:

1. An adjustable phase interpolator comprising:
   a phase interpolator circuit having differential voltage input terminals, and a voltage output terminal; and
   a first controllable capacitive load coupled to the differential voltage input terminals of the phase interpolator circuit for providing a controllable amount of capacitance at the voltage output terminal to improve linearity of the phase interpolator.

2. The adjustable phase interpolator of claim 1, wherein the differential voltage input terminals comprise first and second differential voltage terminals, such that the first differential voltage terminal receives a first voltage input signal having a first phase, and the second differential voltage terminal receives a second voltage signal having a second phase; and,
   wherein the voltage output terminal produces an output voltage having a controllable phase between the first and second phases.

3. The adjustable phase interpolator of claim 2, further comprising:
   a first transistor pair including a first transistor and a second transistor having sources commonly coupled;
   a second transistor pair including a third transistor and a fourth transistor having the sources commonly coupled;
   first and second tail current sources, wherein the first tail current source is coupled to the commonly coupled sources of the first and second transistors, and wherein the second tail current source is coupled to the commonly coupled sources of the third and fourth transistors;
   a first resistive load commonly coupled to the drain of the first transistor and the drain of the fourth transistor, and a second resistive load commonly coupled to the drain of the second transistor and the drain of the third transistor;
   wherein the first voltage input signal is applied across the gates of the first and second transistors and the second voltage input signal is applied across the gates of the third and fourth transistor; and
   wherein the voltage output terminal is formed by a first connection to commonly coupled drains of the first and fourth transistors, and by a second connection to the commonly coupled drains of the second and third transistors.

4. The adjustable phase interpolator of claim 3, wherein at least one of the first transistor pair and second transistor pair comprises one selected from a group consisting of: N-type metal oxide semiconductor filed effect transistors (MOSFETs), P-type MOSFETs, and bipolar junction transistors (BJTs).

5. The adjustable phase interpolator of claim 3 wherein at least one of the first resistive load and second resistive load comprises one selected from a group consisting of: resistors, diode-connected NMOSFETs, and P-MOSFETs with grounded gates.

6. The adjustable phase interpolator of claim 1, wherein the first controllable capacitive load comprises:
   a capacitive load coupled across the differential voltage input terminals.

7. The adjustable phase interpolator of claim 6, wherein the first controllable capacitive load comprises a plurality of MOSFETs connected across the differential voltage input terminals, the plurality of MOSFETs being connected to a plurality of control lines.

8. The adjustable phase interpolator of claim 6, wherein the first controllable capacitive load further comprises a plurality of digitally controlled switches connected across the differential voltage input terminals, the plurality of digitally controlled switches being connected to a plurality of control lines.

9. The adjustable phase interpolator of claim 2, further comprising:
a second controllable capacitive load coupled to the second differential voltage input terminal of the adjustable phase interpolator.

10. The adjustable phase interpolator of claim 9, wherein the first and second controllable capacitive loads are commonly connected to a first plurality of control lines, the first plurality of control lines respectively receiving first control signals.

11. The adjustable phase interpolator of claim 10, further comprising an third controllable capacitive load connected to the voltage output terminal.

12. The adjustable phase interpolator of claim 11, wherein the third controllable capacitive load is connected to a second plurality of control lines respectively receiving second control signals.

13. A memory control system comprising:
a master device;
a plurality of memory units coupled to the master device via a channel, wherein at least one of the plurality of memory units includes a memory interface, the memory interface comprising:
a transceiver circuitry adapted to receive control signals from the master device;
a decoder circuit adapted to translate the control signals; and
a phase interpolator coupled to the decoder circuit, the phase interpolator comprising:
a phase interpolator circuit having a voltage input terminal and a voltage output terminal; and
a controllable capacitive load coupled to the voltage input terminal of the phase interpolator circuit for providing a controllable amount of capacitance at the output terminal to improve linearity of the phase interpolator, whereby a variable capacitance is presented at the voltage input terminal in response to control of the capacitive load.

14. An adjustable phase interpolator comprising:
a phase interpolator circuit having at least one voltage input and a voltage output providing an output signal having a predetermined voltage swing;
a controllable resistive load coupled to the voltage output of the phase interpolator circuit, wherein the controllable resistive load is adjusted to improve linearity of the phase interpolator; and
a controllable current source coupled to the controllable resistive load for varying in inverse relation to the controllable resistive load, such that the voltage swing of the output signal is maintained when the controllable resistive load is adjusted.

15. The adjustable phase interpolator of claim 17, wherein the phase interpolator circuit comprises:
a first transistor pair including a first transistor and a second transistor having sources commonly coupled;
a second transistor pair including a third transistor and a fourth transistor having sources commonly coupled;
first and second controllable tail current sources, the first controllable tail current source being coupled to the commonly coupled sources of the first and second transistors, and the second controllable tail current source being coupled to the commonly coupled sources of the third and fourth transistors;

wherein the controllable resistive load, further comprises:
a first variable resistive load commonly connected to the drains of the first and third transistors, and
a second variable resistive load commonly connected to the drains of the second and fourth transistors.

16. The adjustable phase interpolator of claim 15, wherein the controllable current source further comprises:
a PMOS device having a source coupled to a positive power supply (Vdd) via a reference variable resistive load, and having a drain coupled to a gate and a drain of an NMOS device, and a source of the NMOS device is coupled to ground;
an operational amplifier driven by a reference voltage and coupled to a gate of the PMOS device;
whereby a reference current is established in relation to the reference voltage and the variable resistance load.

17. The adjustable phase interpolator of claim 15, wherein the first variable resistive load and the second variable resistive load receive a plurality of control lines.

18. The adjustable phase interpolator of claims 17, wherein the controllable resistive load further comprises a third resistive load coupled to the reference/bias circuit.

19. The adjustable phase interpolator of claim 15, wherein at least one of the first and second variable resistive loads comprises:
a transistor; and
a plurality of additional transistors connected in parallel with the transistor;
wherein each gate of each transistor in the plurality of additional transistors is connected to one of a plurality of control lines.

20. The adjustable phase interpolator of claim 19 wherein a resistance of the resistive loads is determined by selecting at least one of the plurality of control lines.

21. A phase interpolator responsive over a predetermined range of frequencies, comprising:
a phase interpolator having at least one input and an output;
a current source coupled to the phase interpolator;
a variable resistive load coupled to the output of the phase interpolator;
a variable capacitive load coupled to at least one of the at least one input and output of the phase interpolator for providing a controllable amount of capacitance at the output to improve linearity of the phase interpolator;
wherein adjustment of at least one of the variable resistive load, or and the variable capacitive load causes the phase interpolator to adjust operating frequency within the predetermined range of frequencies.

22. An adjustable phase interpolator comprising:
a phase interpolator circuit comprising a first input receiving a first signal with a first phase, and a second input receiving a second input signal with a second phase, wherein the first and second input signals have substantially the same frequency;
the phase interpolator circuit further comprising an output producing an output signal with a phase between the first phase and the second phase; and
a variable capacitive load coupled to the output of the phase interpolator circuit and receiving a control signal for providing a controllable amount of capacitance at the output of the phase interpolator to improve linearity of the phase interpolator, wherein the capacitance apparent at the output of the phase interpolator circuit and operating frequency of the phase interpolator circuit are adjusted in accordance with the control signal.

23. An adjustable phase interpolator comprising:

a phase interpolator circuit comprising a first input receiving a first input signal with a first phase, and a second input receiving a second input signal with a second phase, the first and second input signals having the same frequency;

the phase interpolator circuit further comprising an output producing an output signal having a phase within a predetermined range bounded by the first phase and the second phase; and a first variable capacitive load coupled to the first input of the phase interpolator circuit for providing a controllable amount of capacitance at the output of the phase interpolator to improve linearity of the phase interpolator, wherein the first variable capacitance load receives a first control signal adjusting the capacitance of the first variable capacitive load such that a first operating frequency of the phase interpolator circuit is determined within the predetermined range.

24. The adjustable phase interpolator of claim 23, further comprising a second variable capacitive load coupled to the second input of the phase interpolator circuit, wherein the second variable capacitance load receives a second control signal adjusting the capacitance of the second variable capacitive load such that a second operating frequency of the phase interpolator circuit is determined within the predetermined range.

25. The adjustable phase interpolator of claim 24, wherein the first control signal and the second control signal are the same.

26. An adjustable phase interpolator comprising:

a phase interpolator circuit comprising a first input receiving a first input signal with a first phase and a second input receiving a second input signal with a second phase, the first input and the second input signals having the same frequency;

the phase interpolator circuit further comprising an output node producing an output signal having an output phase within a predetermined range bounded by the first phase and the second phase; and a controllable resistive load circuit coupled to the output node and receiving a resistance control signal for adjusting resistance of the controllable resistive load circuit to improve linearity of the phase interpolator;

wherein the controllable resistive load circuit is adjusted to provide the operating frequency for the phase interpolator circuit within the predetermined range.

27. The adjustable phase interpolator of claim 26, further comprising a controllable reference current source receiving a resistance control signal and having an output coupled to the resistive load of the phase interpolator circuit.

* * * * *

UNITED STATES PATENT AND TRADEMARK OFFICE
CERTIFICATE OF CORRECTION

| | |
|---|---|
| PATENT NO. | : 6,133,773 |
| APPLICATION NO. | : 08/947477 |
| DATED | : October 17, 2000 |
| INVENTOR(S) | : Bruno Werner Garlepp et al. |

It is certified that error appears in the above-identified patent and that said Letters Patent is hereby corrected as shown below:

In claim 15, at column 13, line 56, reference to "claim 17," should instead read "claim 14,"

Signed and Sealed this

Twenty-fifth Day of August, 2009

David J. Kappos
*Director of the United States Patent and Trademark Office*